United States Patent [19]

Thery et al.

[11] Patent Number: 4,850,713

[45] Date of Patent: Jul. 25, 1989

[54] DEVICE FOR MEASURING THE INTENSITY OF A RADIATIVE FLUX AND OPTIONALLY ALSO MEASURING THE INTENSITY OF A CONVECTIVE FLUX

[75] Inventors: Pierre Thery, Villeneuve D'Ascq; Didier Leclercq, Lille; Philippe Herin, Maubeuge, all of France

[73] Assignee: Agence Nationale De Valorisation de la Recherche, France

[21] Appl. No.: 50,249

[22] Filed: May 14, 1987

[30] Foreign Application Priority Data

May 16, 1986 [FR] France .................................. 86 07072

[51] Int. Cl.[4] ...................... G01K 17/00; G01K 17/08
[52] U.S. Cl. ........................................ 374/30; 374/29; 374/122; 136/225
[58] Field of Search .............. 374/29, 30, 122, 31, 374/32; 136/225, 227, 206

[56] References Cited

U.S. PATENT DOCUMENTS

| | | | |
|---|---|---|---|
| 3,267,727 | 8/1966 | Benzinger | 374/31 |
| 3,293,082 | 12/1966 | Brouwer et al. | 136/206 |
| 3,335,043 | 8/1967 | Joerren et al. | 136/225 |
| 3,348,047 | 10/1967 | Clifford | 374/30 |
| 3,354,309 | 11/1967 | Volkovisky | 136/225 |
| 3,390,576 | 7/1968 | Yellott | 374/32 |
| 3,405,273 | 10/1968 | Stevens et al. | 136/225 |
| 4,029,521 | 6/1977 | Korn et al. | 136/225 |
| 4,382,154 | 5/1983 | Thery et al. | 374/30 |
| 4,717,786 | 1/1988 | Thery et al. | 136/225 |
| 4,722,609 | 2/1988 | Epstein et al. | 374/30 |

FOREIGN PATENT DOCUMENTS

| | | | |
|---|---|---|---|
| 3237912 | 4/1984 | Fed. Rep. of Germany | 374/29 |
| 1052884 | 11/1983 | U.S.S.R. | 374/30 |

OTHER PUBLICATIONS

Tunmore, "A Simple Radiometer for the Measurement of Radiative Heat Exchange Between Buildings and the Environment" J. Sci. Instr. 1962, vol. 39, No. 5, May 1962, pp. 219–221.
Wool et al., "Measurement of Convective Radiative Heat Fluxes at the Surface of Ablative Material", ISA Transactions, vol. 9, No. 2, pp. 94–103, 1970.

Primary Examiner—William A. Cuchlinski, Jr.
Assistant Examiner—Thomas N. Will
Attorney, Agent, or Firm—Ostrolenk, Faber, Gerb & Soffen

[57] ABSTRACT

A device is provided for measuring the intensity of a radiative flux and optionally also a convective flux, including a thin support made from an insulating material; a thin continuous strip of meandering shape made from a first conducting material; a series of discontinuous deposits made from a second conducting material having a thermoelectric power different from that of the first material and a high electric conductivity, the whole of the deposits and of the associated underlying strip portion forming an elementary thermocouple and having, in the transverse direction with respect to the direction of extension of the strip, a width which varies between its two ends, the variation in width being in the same direction for the successive deposits along the strip; and a coating with high emissivity intimately covering at least the successive deposits. The device may also include a heat conducting layer.

21 Claims, 10 Drawing Sheets

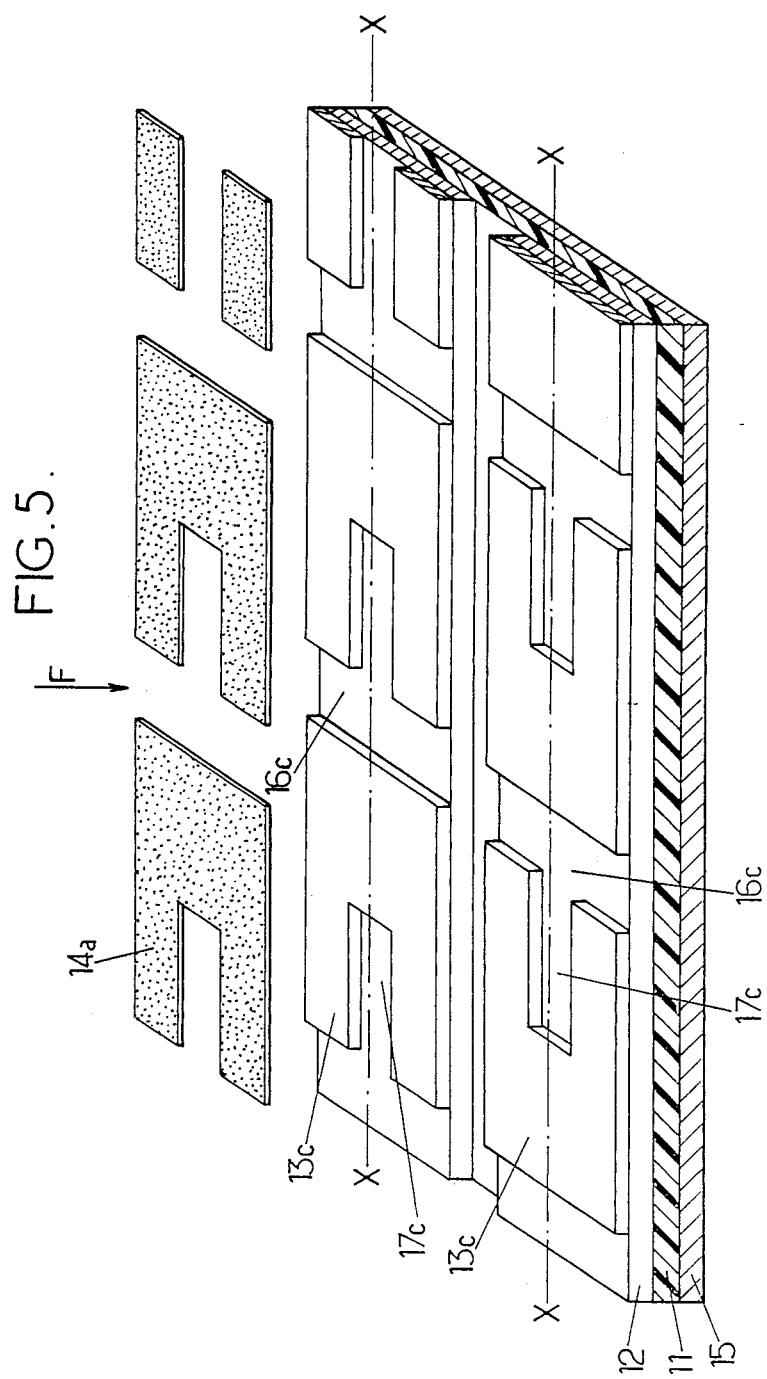

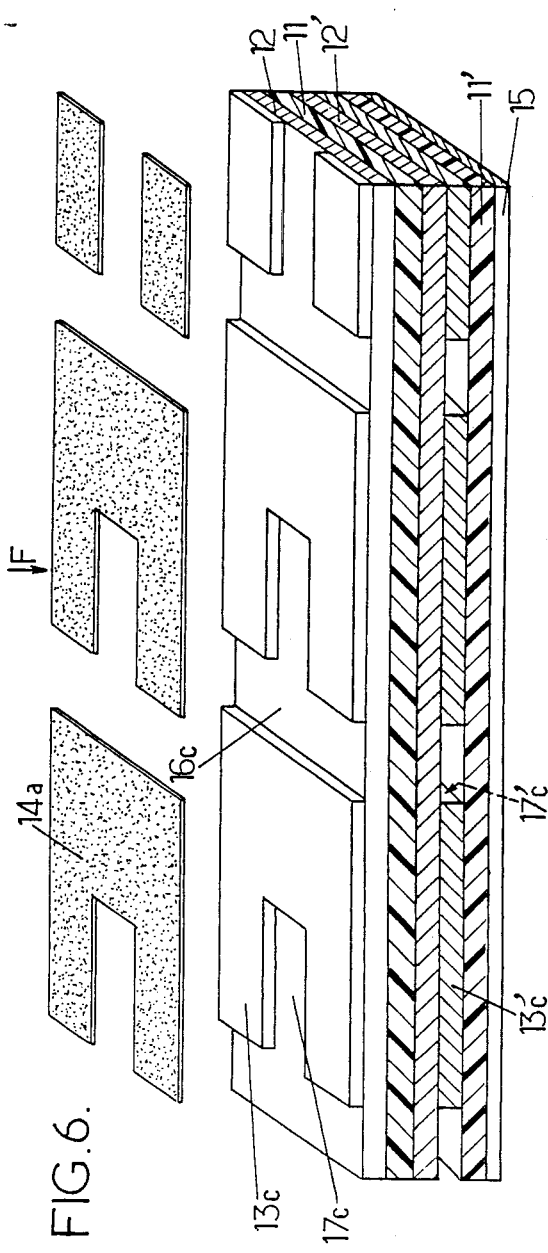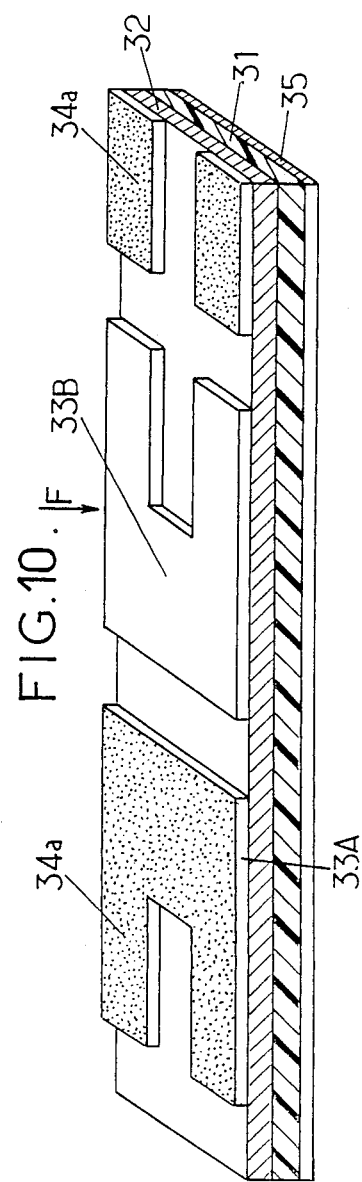

DEVICE FOR MEASURING THE INTENSITY OF A RADIATIVE FLUX AND OPTIONALLY ALSO MEASURING THE INTENSITY OF A CONVECTIVE FLUX

BACKGROUND OF THE INVENTION

1. Field of the Invention

The present invention relates to the measurement of the intensity of a radiative flux, more particularly a thermal radiation emitted or received by a surface or wall so as to measure in particular the net thermal flux lost or gained by said wall or surface and, possibly, a convective flux.

It is known that radiative energy transfers play a very important role in numerous industrial mechanisms, in particular in the heating of premises.

In such mechanisms, the net thermal flux Fn lost or gained by a surface or wall is equal to the algebraic difference between the radiative flux Fe which it emits and the radiative flux Fa which it absorbs: $Fn = Fe - Fa$.

The net flux Fn takes into account the whole of the radiative exchanges and it is positive if the surface or wall emits more thermal radiation than it absorbs, whereas Fn is negative if the surface or wall absorbs more thermal radiation than it emits.

If we desire to maintain the temperature of a surface or wall constant, this surface or wall must be provided with a heating power equal to Fn if Fn is positive, or on the contrary remove therefrom heating power equal, in absolute value, to Fn if Fn is negative.

In practice, the radiative exchanges are measured between two surface or walls brought to different temperatures T1 and T2, or of a surface or wall which is at a temperature T1 and which is subject to a radiant temperature T2 representative of the radiative exchanges with the whole of the environmental medium.

Depending on the sign of the difference T1−T2 a net radiative flux is emitted by the surface or wall at temperatures T1 or is received thereby.

The purpose of the invention is precisely to provide a device for measuring the intensity of a radiative flux emitted or received by a surface or wall, which device is exact, accurate and sensitive, has a reduced time constant and is adapted to be applied to a surface or wall.

Generally the intensity of a radiative flux is measured by converting this radiative flux into a temperature difference in a device which receives this radiative flux, which converts this flux into a temperature difference as a function of this flux and which measures this temperature difference.

For this, the following may in particular be used:

an uninterrupted succession of two types of thermoelectric elements, of different thermoelectric powers, alternating and connected in series, thus forming a succession of successive thermoelectric couples with a series of thermoelectric junctions between two successive thermoelectric elements of different thermoelectric powers;

two types of coatings disposed alternately on the successive thermoelectric junction of the series of junctions, the coatings of the first type having a high absorbing power (so a high emissive power e1), whereas the coatings of the second type have a high reflecting power (so a low emissive power e2), with respect to the radiative flux F to be measured, so as to convert the radiative flux into a temperature difference between two successive thermoelectric junctions, while creating hot sources at the level of the junctions covered with coatings of the first type and cold sources at the level of alternate junctions covered with coatings of the second type, the hot sources receiving thermal energy proportional to e1F and the cold sources thermal energy proportional to e2F, the temperature difference between a hot source and an adjacent cold source being proportional to the intensity of said radiative flux F; and means for measuring the sum of the elementary electromotive forces (e.m.f) produced by the elementary thermoelectric couples connected in series and each formed by a pair of successive thermoelectric elements of different thermoelectric powers and each including such a hot source and such a cold source, each elementary e.m.f being representative of said temperature difference and therefore of the intensity of said radiative flux.

2. Description of the Prior Art

Such a device is described for example in the U.S. Pat. No. 3,267,727, issued on the 23 Aug. 1966 to Mr. Theodore H. Benzinger.

In the device of this patent there is modulation of the incident radiant flux by the spatially variable emissivuty (high for coatings of the first type, but low for coatings of the second type) and this spatial variation of the radiative exchanges causes a variation of the surface temperature in the succession of series connected elementary thermocouples, while creating alternate hot sources and cold sources at the level of the different emissivity coatings.

Such a device has a relatively reduced sensitivity, of the order of 100 $\mu V$ per watt of radiative flux received and per dm2 of surface exposed to the radiative flux.

In order to increase the sensitivity of this type of radiative flux detector it is advantageous to increase the temperature difference between the hot sources and the cold sources, more especially by providing as high an emissivity difference as possible between the two types of coatings (of the first and of the second type respectively). A plastic insulating sheet of sufficient thickness could also be disposed between the thermopile and its support for increasing said temperature difference.

But such an increase in the temperature difference has drawbacks. In fact, the temperature differences between the hot sources and the cold sources tend to produce convective thermal exchanges between these two kinds of sources, these convective exchanges (which are all the higher the greater the temperature difference between the hot sources and the cold sources) generating in their turn surface temperature variations, which results in each said elementary thermocouple being subjected, between its hot sources and its cold sources, not only to the temperature difference (which it would be necessary to determine) resulting from the radiative flux to be measured, but also to a temperature difference resulting both from this flux and from said convective exchanges; thus, the temperature difference between each hot source and each cold source is no longer exactly proportional to the radiative flux and the same goes for the elementary e.m.f generated by each thermocouple. Thus, the sum of the elementary e.m.f.s connected in series is no longer an exact measurement of the radiative flux which it is designed to determine. Furthermore, the much higher convective exchanges (produced by ventilation for example) should also be taken into account which exist in the environment where the radiative flux measurement is being carried out.

To overcome these drawbacks, the invention proposes transforming the radiative flux to be measured directly into an electric voltage without passing through a temperature difference, so as to increase the sensitivity and reduce the above mentioned disturbances due to the convective thermal exchanges.

For this, using a chain of thermoelectric elements or elementary thermoelectric couples connected in series, which chain is formed by a continuous strip of a first conducting material covered in places with discontinuous deposits of a second conducting material having a thermoelectric power difference from that of the first material and a high electric conductivity;

each thermoelectric couple is unbalanced, by construction, in the longitudinal direction of the thermoelectric couple chain by creating, in this longitudinal direction, a spatial variation in the width of the thermoelectric element chain, namely the width of the continuous strip and/or of the deposits so as to make the thermoflux lines disymmetrical in the plane of this strip;

this strip is disposed on a thin support made from an insulating substance;

at least said deposits are covered with a high emissivity coating so that transformation of the radiative flux into heat localized in this high emissivity coating causes disymmetric tangential heat transfers in the thermoelectric element chain because of the presence of the electrolytic deposit of high thermal conductivity; and the electromotive force is measured which is available between the two ends of this continuous strip, this electromotive force being proportional to the deflection of the thermal flux lines and so to the radiative flux which reaches said coating.

SUMMARY OF THE INVENTION

The present invention provides then a device for measuring the intensity of a radiative flux and including in combination:

a thin support made from an insulating material;

a thin elongate continuous strip, made from a first conducting material, one of its faces being fixed to said support;

a series of discontinuous deposits, made from a second conducting material, disposed successively in the extension direction of said strip, on the other face thereof, this second conducting material having a thermoelectric power different from that of the first conducting material and a high electric conductivity and these deposits being thinner than said strip; and means for determining the electromotive force available at the ends of said elongate continuous strip; wherein the assembly formed by one of said deposits and the associated portion of the underlying continuous strip forming an elementary thermocouple has, in the transverse direction with respect to the extension direction of said strip, a width which varies between its two ends, in the extension direction of said strip, the variation in width being the same direction for the deposits succeeding each other along said strip; and it includes a high emissivity coating intimately covering at least said successive deposits.

This variation in width of the above mentioned deposit-associated strip portion assembly may be provided by varying the width of the deposit, by varying the width of the strip portion, by varying the width of the deposit and of the strip portion, by providing at least one hole or recess which transversely cuts the deposit and the strip portion, the hole or recess being always offset in the same direction, in the longitudinal direction of the strip, with respect to the center of the deposits; in particular this hole or recess if formed from one end (always in the same direction in the extension direction of the strip) of each deposit.

By way of example, the difference in width, in the transverse direction, of the deposits and possibly of the continuous strip, which causes the disymmetry of the tangential thermal flux lines may be obtained by giving to each deposit and possibly to the adjacent strip portion a spatial variation in the form of an isoceles (or at the limit equilateral) triangle, of an isoceles trapezium, of a T or of a U, the axis of symmetry of the isoceles triangle, of the trapezium, of the T or of the U being aligned with the longitudinal axis of the strip and the apex of the isoceles triangle, which is disposed on this axis, the small base of the trapezium, the bar of the T or the opening of the U being directed in the same direction if we consider the extension direction of the strip.

In a first type of embodiment, the device includes a coating with high emissivity intimately covering both said deposits, and the zones of the continuous strip not coated with deposits.

This high emissivity coating may iself be covered with a "honeycomb" type of structure preventing tangential circulation of air above the surface of the coating.

In a second type of embodiment, the device includes a coating with high emissivity covering solely said deposits.

In this second type of embodiment, the device may advantageously further comprise a reflecting coating, namely with low emissivity, on the zones of the continuous strip not coated with a deposit.

In the preferred embodiments, the continuous strip is advantageously bent so as to have a meandering configuration.

The first conducting material forming the continuous strip is for example the alloy called "constantan", the second conducting material forming the deposits is for example copper and the insulating material forming the support is for example the plastic material of polyamide type named "kapton".

As for the coating with high emissivity (close to 1) it may be formed by a matt black paint, for example of the platinum type or of the gold type called "black gold", or (particularly when the deposits alone are covered with a high emissivity coating) by a black copper oxide film on the deposits when they are made from copper, this film being obtained for example by surface oxidization of the copper of the deposits by heating them to a high temperature in an oxidizing atmosphere.

The coatings with low emissivity (close for example to 0.1) may be formed by an aluminium film or aluminium paint.

When the device of the invention is to be applied to a surface or wall it may be advantageous to cover the face of the device to be applied on the surface or wall with a layer of very good heat conducting material such as copper so as to obtain a mean uniform temperature on this face to the scale of the elementary thermoelectric couples.

In order to increase the sensitivity, the device of the invention may be doubled by disposing against each face of the support a continuous strip covered with deposits with the high emissive power coating on at least the deposits.

In this case, an additional support, also made from an insulating material, is advantageously provided which is applied against one of the faces of the double face device, namely the one which is to be applied against a surface or wall, whereas the other face receives the radiative flux to be measured. In this case, the heat conducting layer, for example made from copper, is deposited on the face of the additional support which is not against the active part of the device.

Advantageously, the convective thermal exchanges may be perfectly counterbalanced by associating two radiative fluxmeters of the invention having exactly the same geometrical structure for their continuous strip and their deposits, but being covered with coatings of different emissivities, one of the two fluxmeters possibly not even including such a coating, so as to transform different radiative flux amounts to tangential thermal flux when they are subjected to the same convective exchanges coming from the ambient medium. The difference between the measurement results from the two fluxmeters, both subjected to the same convective exchanges, cause the measurement of the radiative flux alone to appear, since the effects of the convective thermal exchanges are identical in both fluxmeters and therefore disappear in this difference.

Thus, the two fluxmeters (having the same geometric configuration is so far as the continuous strip and the deposits are concerned) may be disposed on the same face of an insulating material support, the continuous strips, with the deposits, of the two fluxmeters being imbricated in each other.

As a variant, the two fluxmeters may be formed from a common continuous strip coated with alternate deposits belonging respectively to the first and to the second fluxmeter, the deposits covered with a high emissivity coating of one of the fluxmeters alternating with the deposits without such a coating of the thermal fluxmeter and the two types of alternate deposits being oriented in opposite directions in so far as the variation of the width is concerned, considering the longitudinal direction of the common continuous strip.

In fact, the fluxmeter with the less emissive coating, or with no coating at all, forms essentially a compensation thermal fluxmeter (especially when it has no coating) for eliminating the convective thermal exchanges from the overall differential measurement.

BRIEF DESCRIPTION OF THE DRAWINGS

Other objects and advantages of the present invention will become more apparent from the following detailed description of the preferred embodiments thereof to be read in conjunction with the accompanying drawings, where:

FIG. 5 illustrates, in a similar way, a third embodiment of a device for measuring the intensity of a radiative flux implementing the invention, according to a second type of embodiment, in which the highly emissive coating, (shown separate from the rest of the device) covers only the deposits, which in this third embodiment have the shape of the letter U, the continuous strip having a constant width.

FIG. 6 illustrates, in isometric projection, a portion of a fourth embodiment which is a variant of the embodiment shown in FIG. 5, namely a double face radiative fluxmeter having, on each face of the insulating material support, a continuous strip with deposits and highly emissive coatings in accordance with the embodiment shown in FIG. 5.

on the one hand, a second compensation fluxmeter is provided whose continuous strip is imbricrated with the continuous strip of the first fluxmeter shown in FIG. 5, and on the other hand, the two fluxmeters have a double face and are disposed on each side of the insulating material support, FIG. 7 (similar to FIG. 5) illustrates in perspective a median part and FIG. 8 illustrates in perspective an end part of the two double face fluxmeters, whereas FIG. 9 is a plane view on a smaller scale of the assembly of the two double face fluxmeters.

FIG. 10 illustrates partially and in isometric projection another embodiment including two fluxmeters with a single continuous strip having successive deposits which form part alternately of the first fluxmeter (deposits covered with a high emissive coating) and of the second fluxmeter (deposits not covered with such a coating).

DESCRIPTION OF U.S. PAT. NO. 3,267,727

Before describing in detail how a device is constructed in accordance with the invention for measuring the intensity of a radiative flux, a device for such a measurement will be described with reference to FIGS. 1 and 2 in accordance with the prior technique substantially following the teaching of the above mentioned U.S. Pat. No. 3,267,727.

Figure 1:
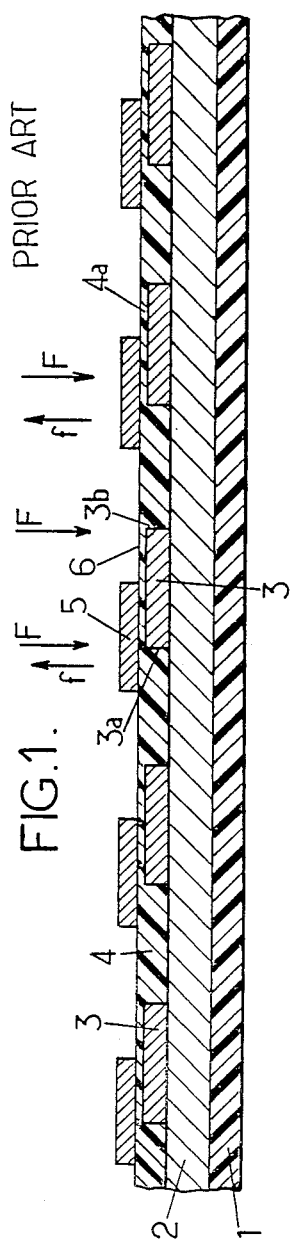
FIGS. 1 and 2 are views, respectively in section through I—I of FIG. 2, and in a top plane view, of a device for measuring a radiative flux, of known type, substantially in accordance with the above mentioned U.S. Pat. No. 3,267,727.
Figure 2:
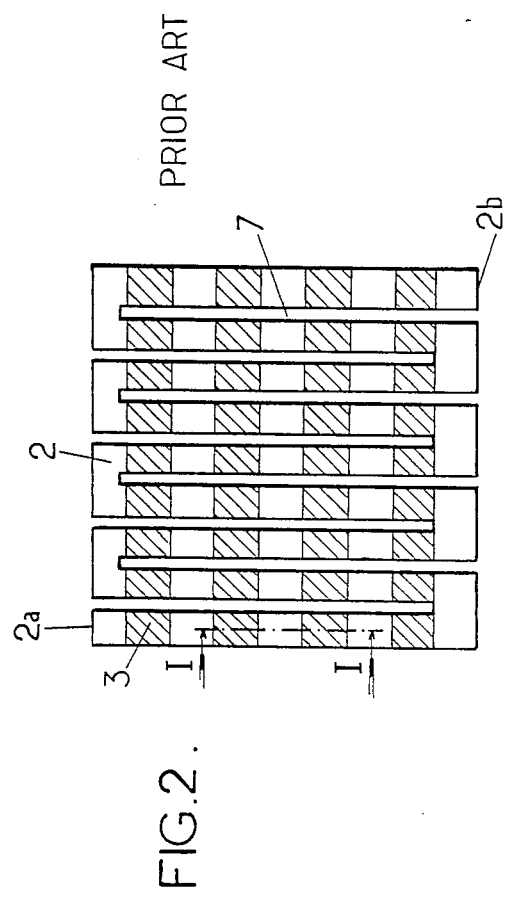

The device shown in FIGS. 1 and 2 includes, on a square or rectangular insulating support 1, a conducting meandering strip 2, made for example from an alloy called constantan, on which are disposed rectangular conducting plates 3, made for example from copper, an insulating resin with high emissive powers fills the spaces 4 between the plates 3 above the zones of the continuous strip 2 not covered with plates 3 and also covers the plates 3 in the form of a thin film 4a.

Finally, the device includes plate 5 made from a reflecting material, that is to say with a low emissivity coefficient, for example from aluminium, which is astride half of the strip 2-plate 3 junctions, namely astride one junction out of two of this type.

The upper face considering FIG. 1) of the device has then an alternation of reflecting zones 5 with low emissive power and zones 6 with high emissive power, respectively on the first end 3a and the second end 3b of each plate 3.

When this upper face receives a radiative flux shown by the arrows F, this flux is reflected substanitally entirely by the plates 5 (arrows f), but is absorbed substantially entirely by the resin in zones 6. Thus, the strip 2-plate 3 junctions at the ends 3a form cold sources whereas the strip 2-plate 3 junctions at ends 3b become hot sources, the temperature difference between a hot source and a cold source being substantially proportional to the intensity of the radiative flux F, if we ignore the radiative thermal exchanges which were mentioned above.

The device of FIGS. 1 and 2 converts then first of all the intensity of a radiative flux F into temperature differences between the ends 3a and 3b, which temperature differences are then converted into e.m.f. by the elementary thermoelectric couples comprising a copper plate 3 and the portion of the continuous constantan strip 2 included between a cold source 3a and a hot source 3b.

These different elementary thermocouples are connected in series by construction because strip 2 is a continuous strip, in fact a meandering strip as can be seen in FIG. 2, the successive meanders of strip 2 being separated by gaps 7. The sum of the elementary electromotive forces generated by each elementary thermocouple, in response to the intensity of the radiative flux F, is available between the ends 2a and 2b of strip 2 and it is sufficient to measure the total resultant electromotive force, available between ends 2a and 2b, with a device of known type for measuring the e.m.f.s so as to have a measurement of the intensity of the radiative flux F.

However, as mentioned above, this measurement is not very sensitive and is further impaired by an error which results from the radiative thermal exchanges between the hot sources 3b, on the one hand, and the cold sources 3a on the other, which exchanges tend to reduce the temperature difference between the hot sources and the cold sources, which results in an error in the measurement of the intensity of the radiative flux, the total measured e.m.f. being smaller than that which would correspond to the intensity of the radiative flux F in the absence of such radiative exchanges. Furthermore, the thermocouples of this prior patent are sensitive to convection exchanges (due for example to ventilation) which generally cause spatial temperature variations over the surface of the sensor.

DESCRIPTION OF THE PREFERRED EMBODIMENTS

The present invention aims at overcoming the above drawbacks of a device such a shown in FIGS. 1 and 2, which is essentially based on the differences in emissivity of the alternate zones 5 and 6 covering alternate strip 2-plate 3 contacts, which differences in emissivity produce temperature differences at the level of these alternate contacts at 3a and 3b.

In accordance with the invention, the flux F is transformed directly into an e.m.f. (which will be measured), without effectively passing through a temperature difference, and in the preferred embodiments the errors are compensated for which are introduced by the convective thermal exchanges on the surface of the fluxmeter.

In accordance with the invention and more especially according to that one of its modes of application, as well as according to those embodiments of its different parts, to which it seems preference should be given, desiring for example to construct a device for measuring the intensity of a radiative flux, the following or similar is how to set about it.

Figure 3:
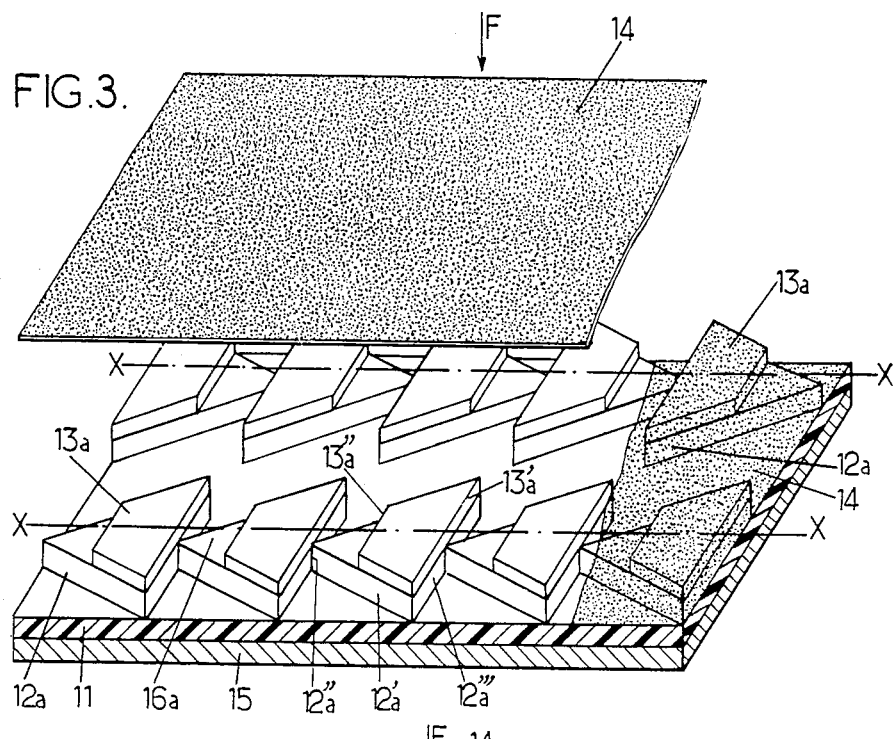
FIGS. 3 and 4 illustrate, in isometric projection, portions of two embodiments of a device for measuring the intensity of a radiative flux implementing the invention, in accordance with a first type of embodiment, in which the highly emissive coating (shown partially separated from the rest of the device) covers both the whole of the deposits and the continuous underlying strip, the deposits having the form of isoceles trapezia in the case of FIG. 3 and the form of a letter T in the case of FIG. 4, and being disposed on a continuous strip formed by an uninterrupted succession of isoceles ( in fact equilateral) triangles and "T"s, respectively in FIGS. 3 and 4.
Figure 4:
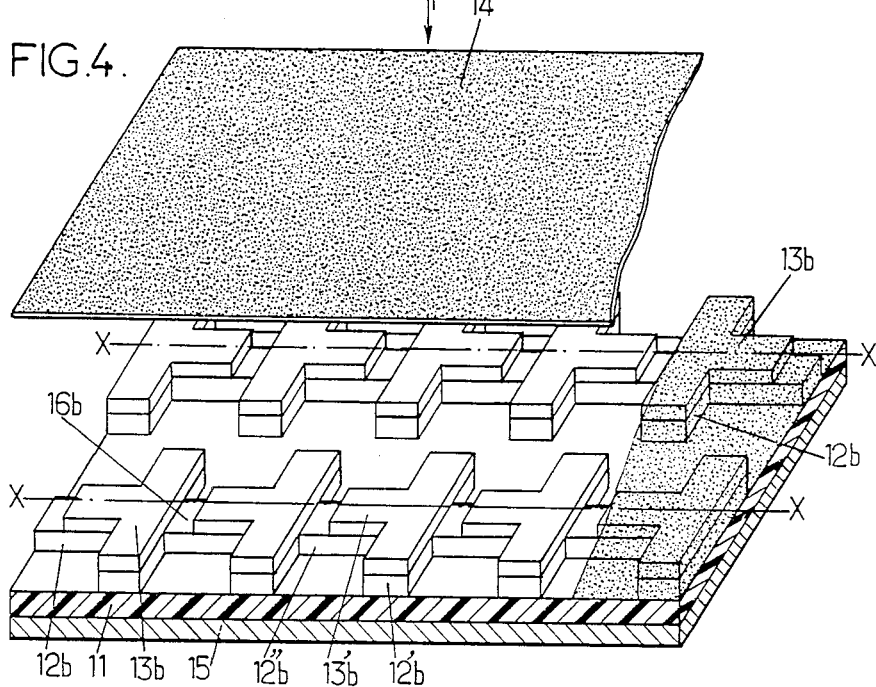

A first type of embodiment with continuous strip of variable width, of such a device is illustrated in FIGS. 3 and 4 which show; in perspective, only a part of the device which is in fact, as shown in FIG. 2, in the form of a meandering structure, FIGS. 3 and 4 illustrating a portion of two successive meanders of the meandering device.

In the two embodiments shown in FIGS. 3 and 4, a thin support 11 is provided made from an insulating material, for example from the plastic material called "kapton", this support being rectangular or possibly square. On this support is disposed a thin continuous meander strip 12a and 12b (of the same type as the strip 2 shown in FIG. 2), this strip 12a and 12b being made from a first conducting material, for example from the alloy called "constantan" and having a form such that the width (in the transverse direction with respect to the axis XX of extension of a meander) varies in the direction of axis XX.

On this continuous strip 12a or 12b are disposed, one behind the other, a series of discontinuous deposits, made from a second conducting material, which are preferably formed electrolytically and for example from copper, being thinner than strip 12a and 12b.

In the embodiment shown in FIG. 3, the continuous strip 12a is formed by an uninterrupted succession of isoceles or even equilateral (as illustrated) triangles 12'a, which touch each other so as to provide the electric continuity of this strip 12a, whereas the deposits 13a have the form of isoceles trapezia whose largest base 13'a coincides with the base 12'''a of triangle 12'a which supports it and whose narrowest base 13''a is on the same side as the apex or tip 12''a of the corresponding triangle 12'a. The symmetry of the triangles 12'a and of the trapezia 13a is relative to the axis XX.

In FIG. 4, a continuous strip 12b is formed by an uninterrupted succession of units 12'b in the form of a letter T which touch each other so as to ensure the electric continuity of this strip 12b and the deposits 13b also have the shape of the letter T but with a shorter longitudinal bar 13'b than the longitundinal bar 12''b of the "T"s of the continuous strip so that the deposits are separated from each other. The "T"s 12'b and 13b of the two series are disposed symmetrically with respect to the axis XX.

It will be noted that the common orientation of the variations of width of the continuous strip and of the discontinuous deposits in the same meander is the same, the apices 12''a of the triangles and the small bases 13''a of the deposits (FIG. 3) and the longitudinal bars 12''b and 13'b of the "T"s (FIG. 4) being directed in the same direction, whereas over two successive meanders the common orientation of the width variation of the strips and the deposits are opposed.

The device shown in FIGS. 3 and 4 also includes a coating 14 made from a material with high emissive power, which is shown in these FIGS. for a large part spaced at a distance from deposits 13a and 13b so as to facilitate understanding of these Figures; this coating 14 is intimately applied against these deposits and the continuous strip 12a and 12b as illustrated in the right hand part of FIGS. 3 and 4. This coating, which has substantially the emissive power of a black body, is for example a black matt paint used for manufacturing black bodies and called in the technique "gold black".

Means (not shown) are connected to the two ends of the meandering conducting strip 12a and 12b (corresponding to the ends 2a and 2b of FIG. 2 which illustrates such a meandering form) so as to measure the total electromotive force produced between these two ends when a radiative flux F of intensity I is directed substantially perpendicularly to the coating 14 of the device of the invention illustrated partially in FIGS. 3 and 4.

Finally, a thin layer 15 may be provided made from a good heat conducting material, such as copper, under support 11 (looking at FIGS. 3 and 4), particularly when the device of the invention is intended to be applied against a surface or wall, layer 15 ensuring standardization, to the scale of the elementary thermocouples, of the mean temperature of this surface or wall whose radiative flux F which it receives or the net radiative flux Fn which it exchanges with the environment or another surface or wall which is at a different temperature it is desired to measure with the device illustrated partially in FIGS. 3 or 4.

It will be noted that the whole of the device: support 11 with meandering continuous strip 12a and 12b, deposits 13a or 13b, coating 14 and layer 15 if required may be advantageously formed as a flexible printed circuit.

The thicknesses of the different layers may be the following:
support 11 : 50 $\mu$m
continuous meandering strip 12 : 25 $\mu$m
deposits 13a or 13b : 6 $\mu$m
coating 14 with high emissivity : 2 $\mu$m
heat conducting layer 15 : 30 $\mu$m The operation of the devices shown in FIGS. 3 and 4 is the following.

The radiative flux is absorbed uniformly by the deposit with high emissivity and is a localized thermal source on the surface of the fluxmeter. Since the thermal fluxes flowing along the paths of least thermal resistance and since support 11 is made from an insulating material having a much lower conductivity than that of the constantan strip of 12a, 12b and of the discontinuous copper deposits 13a, 13b, there is a flow of tangential thermal flux in the continuous strip 12.

The amplitude of the thermal flux in direction XX, in the continuous strip 12a, 12b, depends on the width of this continuous strip and/or on the discontinuous deposits, this amplitude decreasing when this width decreases, all the more so when support 11 is thin, whence the advantage of providing a very thin support 11.

Since the continuous strip 12a, 12b and/or the discontinuous deposits have a variable width (in the transverse direction with respect to the direction XX), the thermal fluxes in direction XX, which coverage towards regions 16a or 16b of the strip 12a, 12b not coated with deposits 13a or 13b, are of unequal amplitude and generate electromotive forces in these regions 16a or 16b.

The discontinuous electrolytic deposits situated on the continuous strip 12a, 12b (deposits 13a or 13b) at the level of the different regions 16a or 16b, cause a division of the net absorbed radiative flux between a component normal to and a component tangential to the surface of the fluxmeter flowing between deposits 13a or 13b and regions 16a or 16b of strip 12a, 12b not covered with copper deposits.

There is then direct conversion of the spatial variations of the net radiative flux at each elementary thermocouple, formed by a copper deposit 13a or 13b and the adjacent portion of the constantan strip 12a, 12b, the elementary e.m.f.s being added together because of the orientation of the deposits 13a and 13b which, over the whole meandering length of strip 12a, 12b, are always directed in the same direction.

The total e.m.f. is readily detectable by the above mentioned measuring means not shown.

Thus a great sensitivity is obtained which may be of the order of 0.4 mV per radiative watt and per square decimenter of the device of the invention and a small time constant of the order of a second.

A second type of embodiment is illustrated in FIG. 5 in which we find again the support 11, advantageously made from Kapton, and the discontinuous deposits advantageously made from copper; the continuous strip, referenced 12, has a constant width in the embodiment of FIG. 5, whereas the deposits, referenced 13c, have in this embodiment the shape of a U, but of course they could also have the configuration illustrated in FIG. 3 or FIG. 4.

It will be noted that the openings 17c of the Us in the same meander are directed in the same direction, whereas in two successive meanders the direction of openings 17c are opposite.

The device of FIG. 5 may also be coated at its lower part, as in the case of FIGS. 3 and 4 with a thin heat conducting layer 15, advantageously made from copper.

The essential difference between the embodiments of FIGS. 3 and 4, in accordance with the first type, and the embodiment of FIG. 5, in accordance with the second type, is due to the fact that instead of having, as in FIGS. 3 and 4, a highly emissive continuous coating 14 which covers the whole of the upper face of the device, in the embodiment shown in FIG. 5 discrete coatings 14a are provided which have the same shape as deposits 13c and which only cover these deposits 13c (in FIG. 5 the coatings 14a of deposits 13c have been omitted soley for facilitating reading of this FIG.).

In the case of the device shown in FIG. 5, the regions 16c of strip 12, not coated with deposits 13c, may be advantageously covered with a paint or coating of very low emissivity, for example an aluminium paint or an aluminium coating having an emissivity of the order of 0.1, whereas coating 14a has an emissivity of the order of 1, like coating 14. The thickness of the coatings of low emissivity may be of the order of 1 $\mu$m.

The same phenomenon of division of the net radiative flux between copper deposits 13a, on the one hand, and regions 16c not coated with copper (including openings 17c) on the other, as in the embodiments shown in FIGS. 3 and 4 occurs in the embodiment shown in FIG. 5. There is then also in this latter embodiment direct conversion of the spatial variations of the net radiative flux into elementary e.m.f.s for each deposit 13c, the sum of the e.m.f.s in series being readily detectable.

A particularly advantageous embodiment of the device shown in FIG. 5 consists in causing surface oxidization of the copper deposits 13c at high temperature in an oxidizing atmosphere, which results in transforming deposits into black copper oxide at the surface of the copper, the surface black copper oxide films forming the coatings 14a with high emissivity (of the order of 1).

To increase the sensitivity of a device of the invention, a double face radiative fluxmeter may be formed by disposing a continuous strip 12a, 12b or 12 covered partially with deposits 13a, 13b or 13c covered in their turn with a continuous coating 14 or with discrete coatings 14a not on a single side of support 11 but a continuous strip partially covered with the deposits on both sides of support 11.

One embodiment of a double face radiative flux of the invention is illustrated in FIG. 6 which only partially shows a single meander.

In FIG. 6 we find again support 11, strip 12, deposits 13c and the discrete coatings 14a as well as the zones 16c of the embodiment shown in FIG. 5; furthermore, under support 11 (considering FIG. 6) a second continuous strip 12' is provided similar to strip 12, that is to say with a meandering shape, this meandering continuous strip 12' being partially covered with deposits 13c similar to deposits 13c, these deposits 13c being covered or not with high emissive coatings (in FIG. 6 the variant has been illustrated without highly emissive coatings on the deposits 13c).

It will be noted that the openings 17c of deposits 13c in a meander of the upper face are all oriented in the same direction, whereas the openings 17'c of the deposits 13'c of the corresponding meander of the lower face are oriented in the opposite direction thereto.

Finally, the assembly described above is placed on an additional support 11', similar to support 11, which may be coated on its lower part with a layer 15 of a good heat conducting material, such as copper, particularly when the device of FIG. 6 is intended to be applied against a surface or wall whose thermal exchanges with the ambient atmosphere or with another surface or wall at a different temperature it is desired to study.

With the double face assembly of the radiative fluxmeter of FIG. 6, the sensitivity is almost doubled per square decimeter of surface and per radiative watt while reaching or approximating a sensitivity of the order of 1 mV per radiative watt and per square decimeter of surface of the double face device.

In the four preceding embodiments (those of FIGS. 3 to 6), convectional thermal exchanges exist between the copper coated deposits 13a, 13b, or 13c, in the air volumes in the spaces (between copper coated deposits) over the regions 16a, 16b or 16c not covered with deposits. These convectional radiative exchanges cause the appearance of a convection e.m.f. which is generally deducted from the e.m.f. due to the radiative flux and which therefore falsifies the measurement of the flux.

These embodiments are also sensitive to the external convective exchanges present on the surface of the fluxmeter.

A particularly advantageous arrangement for accurately measuring solely the radiative flux, while eliminating the e.m.f. due to convective exchanges, consists in using a different assembly for eliminating by compensation the e.m.f.s due to convective exchanges.

For this two radiative fluxmeters of the invention are preferably used having coatings of different emissivities, intimately associated so as to be subjected to the same external radiative exchanges, these fluxmeters absorbing different radiative fluxes taking into account the different emissivities of the coatings used.

The second fluxmeter, called compensation fluxmeter, has the same structure (as described above) as the main fluxmeter and it therefore also includes a continuous strip, advantageously of a meandering shape, made from a first conducting material, such as constantan, with discontinuous deposits, with a disymmetry in so far as the width of the deposits and possibly of the strip are concerned in the transverse direction with respect to the direction of the continuous meandering strip, the deposits of the second fluxmeter not being covered with a highly emissive coating.

To achieve correct compensation, the same geometric form and the same dimensions are given to the deposits of the two fluxmeters of the invention, as well as to the continuous strips of these two fluxmeters.

Thus, if we measure the difference between the sum of the elementary e.m.f.s of the main fluxmeter with highly emissive coatings at least on the discontinuous deposits and the sum of the elementary e.m.f.s of the compensation fluxmeter without such coatings, the influence of the convective thermal exchanges is eliminated because these exchanges cause the same sum of elementary e.m.f.s in the two fluxmeters.

Figure 7:
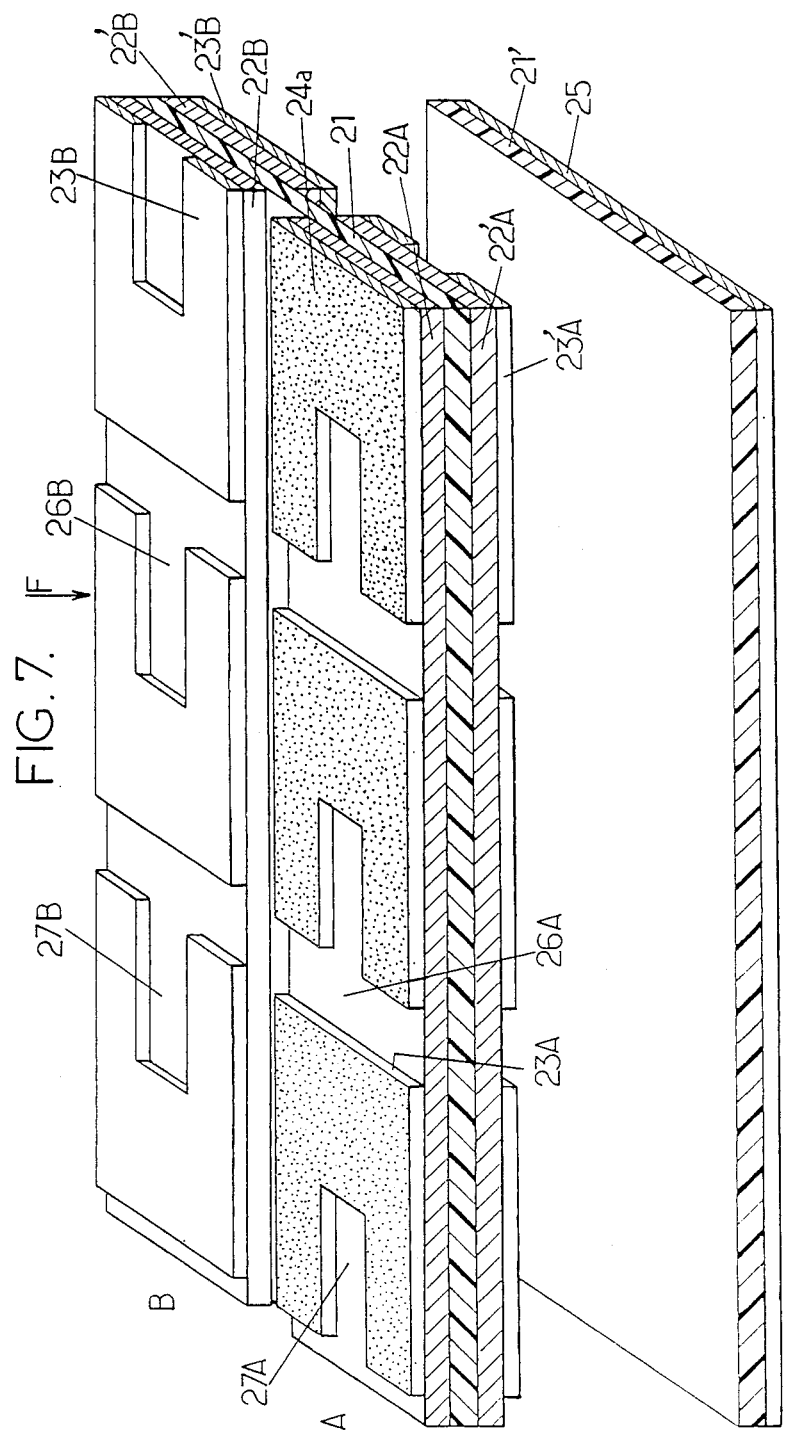
FIGS. 7, 8 and 9 show a fifth embodiment which also derives from the embodiment of FIG. 5, with the two following modifications.
Figure 8:
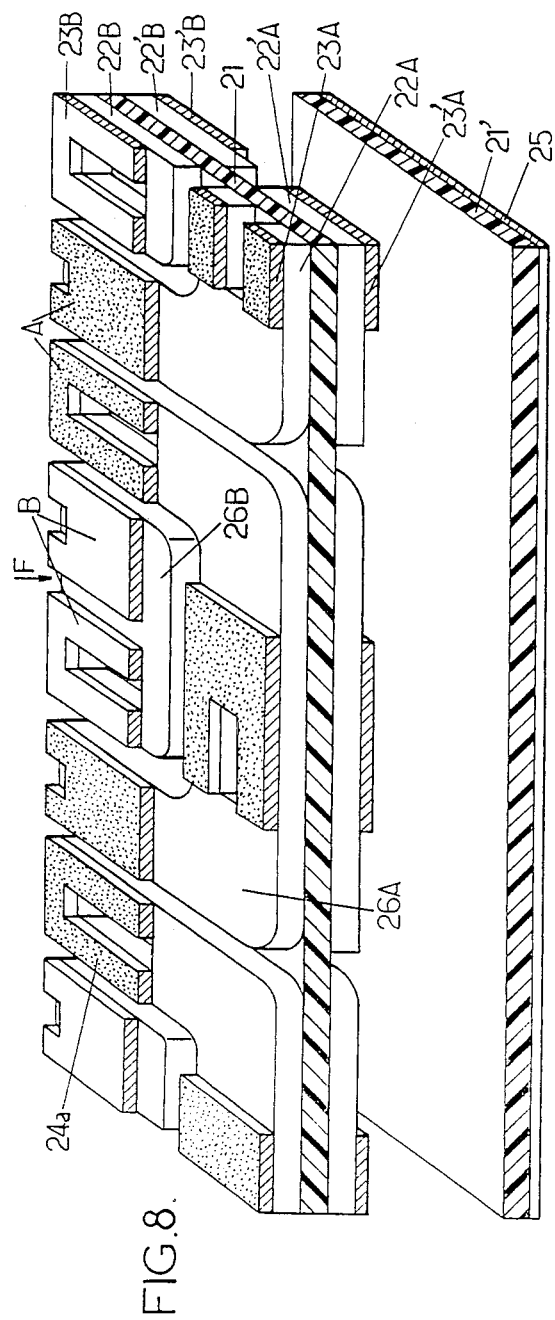
Figure 9:
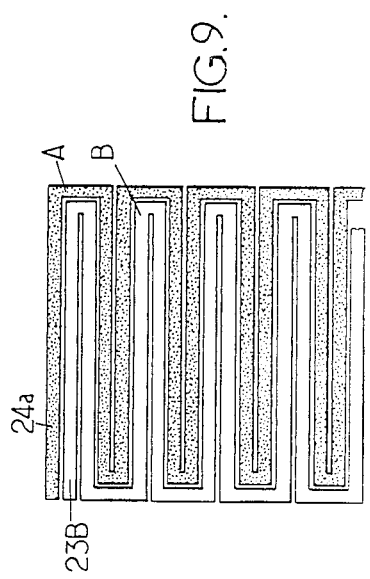

A first embodiment of a combined assembly of two double face radiative fluxmeters of the invention is illustrated in FIGS. 7, 8 and 9. In particular, in FIG. 7, a combined meander including a main fluxmeter portion A and another compensation fluxmeter portion B have been illustrated side by side, both having a double face. FIG. 8 illustrates the same combined double face fluxmeter in perspective but seen in an end view.

The assembly of the two fluxmeters includes an insulating support 21, for example made from kapton, on which are disposed two continuous conducting strips 22a and 22b, for example made from constantan, these two strips being meandering and independent of each other but disposed with their meanders side by side, as illustrated in FIG. 9 which shows in a plane view the assembly of the combined fluxmeter. The two strips 22A and 22B are coated respectively with conducting deposits 23A and 23B, for example made from copper, the free surfaces of the deposits 23A being blackened, for example by oxidization of the copper, so as to form coating 24A with high emissivity, whereas the free surfaces of deposits 23B are not blackened and so present the metal glitter.

Since the two (main A and compensation B) fluxmeters are identical apart from the blackening of deposits 23A and since they are subjected to the same radiative flux F, they undergo the same convective thermal exchanges above portions 26A and 26B not covered with copper coated deposits, the total e.m.f.s produced, in fluxmeters A and B by these radiative exchanges being compensated for exactly because of the similarity of the shapes and of the opposite orientation of openings 27a and 27B of deposits 23A and 23B respectively, for example in the shape of a U as can be seen in FIG. 7.

Thus, if we measure the algebraic sum of the elementary e.m.f.s at the two ends of the double fluxmeter A-B, an overal e.m.f. is obtained which depends solely on the radiative flux while being strictly proportional thereto.

Thus, an integrated device is obtained which measures a radiative flux with excellent precision.

The device shown in FIGS. 7 to 9 may be of the double face type as illustrated, by providing two continuous constantan strips under the kapton support 21, these strips being coated in their turn with discontinuous copper deposits of variable width.

Thus, in FIGS. 7 and 8, two such continuous constantan strips 22'A and 22'B and copper deposits 23'A and 23'B have been illustrated, only deposits 23'A being in their turn covered with highly emissive coatings (not shown).

It will be finally noted that, under the copper deposits 23'A (covered with highly emissive coatings) and 23'B, an additional insulating support 21' is provided, for example made from kapton, and a conducting layer 25, for example made from copper, this layer coming against the surface or wall whose thermal exchanges it is desired to study with the ambient atmosphere or with another surface or wall which is at a different temperature.

The geometric arrangement of these combined radiative fluxmeters, main and compensation, each having a double face, a meander portion of which has been illustrated in isometric projection in FIG. 7 will be better understood with reference to FIGS. 8 and 9, FIG. 9, which represents the assembly of the combined double face fluxmeters seen from above, showing the interfitting arrangement of the continuous strips of the two fluxmeters, namely strip 22A whose deposits 23A are covered with coatings 24A of high emissivity, (in FIG. 9 these coatings 24A have been shown, considering the scale, as if they were continuous, whereas in fact they are discrete as illustrated in FIGS. 7 and 8) and strip 22B whose deposits 23B are not covered with a highly emissive coating.

FIG. 8 is a perspective view like FIG. 7 partially showing one of the ends of the device, for example the left hand end in FIG. 9 and illustrating the imbricated arrangement of the two fluxmeters.

In the embodiment shown in FIGS. 7 to 9, the two radiative fluxmeters are substantially independent while being disposed on each side of a common support 21, the assembly of the fluxmeters being disposed on an additional insulating support 21' possibly covered with a heat conducting layer 25 and they each include a continuous strip on each of the faces of support 21, the two fluxmeters being imbricated or interfitting as can be seen in particular in FIGS. 8 and 9.

Another embodiment of an assembly of two main and compensation fluxmeters is ilustrated in FIG. 10 in which can be seen a perspective view of a part of a single meander of these fluxmeters disposed on a single face of a support 31, made for example from kapton.

In the embodiment of FIG. 10, a single continuous meandering strip 32 has been provided common to the two fluxmeters, and which is coated with a succession of alternate discontinuous deposits 33a, 33b which have the same U shape as the deposits 13c of FIG. 5 and 23A and 23B of FIGS. 7 and 8. However, these discontinuous U shaped deposits are disposed alternately with their openings in one direction (deposits 33A) and in the other (deposits 33B).

Only deposits 33A whose opening is directed in the first direction are covered with a highly emissive coating, 34A, deposits 33b whose opening is directed in the other direction not being covered with a highly emissive coating.

Under these conditions, the continuous strip 32 and deposits 33A with the high emissive coatings, 34A form the main fluxmeter, whereas the same continuous strip 32 with the deposits 33B not covered with high emissive coating, form a compensation fluxmeter essentially sensitive to convective exchanges.

Because of the reversed orientation of deposits 33A and deposits 33b, the e.m.f. generated in the two radiative fluxmeters, through convective thermal exchanges, are exactly offset in the overall e.m.f. available at the ends of the continuous meandering strip 32, common to the two fluxmeters, this overall e.m.f. being an exact measurement of the intensity of the radiative flux F which strikes the upper face of the fluxmeter a portion of which is illustrated in FIG. 10.

We can see, in short, that in the embodiments of FIGS. 3 to 10 a radiative fluxmeter of the invention includes: a continuous strip, advantageously of a meandering shape, made from a first conducting material such as the alloy constantan; a succession of discontinuous deposits made from a second conducting material having a thermoelectric power different from that of the first material and a higher conductivity, this second material being advantageously copper, the discontinuous deposits and possibly the continuous strip having a width (in the transverse direction) which varies when it is considered in the longitudinal direction XX; a coating with high emissive power which covers at least the whole of the discontinuous deposits, this coating possible also covering the regions of the continuous strip over which there are not deposits; and means for measuring the e.m.f. available at the ends of the strip. Advantageously, the fluxmeter is in the form of a flexible printed circuit.

Several possible forms of the deposits (have been indicated) in the shape of an isoceles triangle, in a T or U shape), each of these forms or of these different forms being able to be used in the different embodiments, namely not only in the case of a coating with high emissive power solely on the deposits, with possibly the deposition of a layer with low emissive power on the regions of the continuous strip not covered with the deposits, but also in the case of a coating with high emissive power covering the whole of the deposits and the regions not covered with the deposits.

Figure 11:
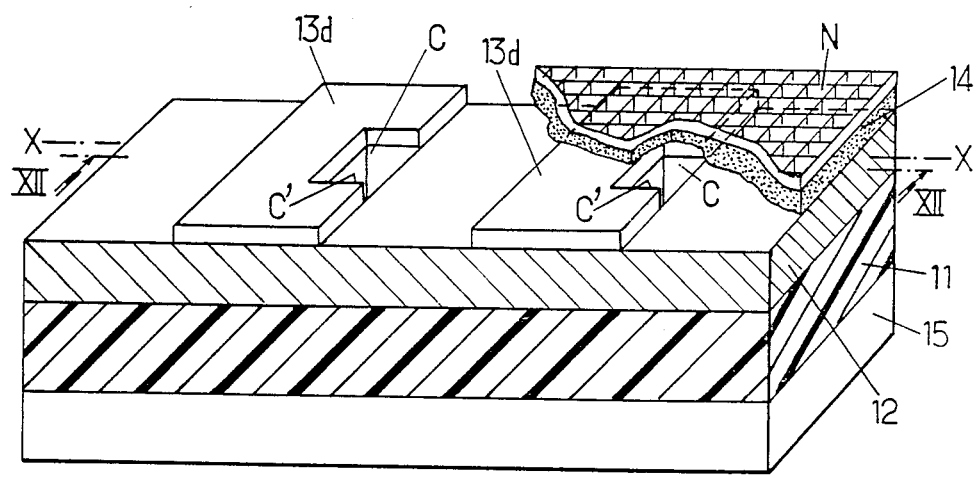
FIGS. 11 and 12 illustrate, respectively in isometric projection and in section through XII—XII of FIG. 11, a part of another embodiment of the invention including holes or channels passing orthogonally through each deposit and the underlying continuous strip portion.
Figure 12:
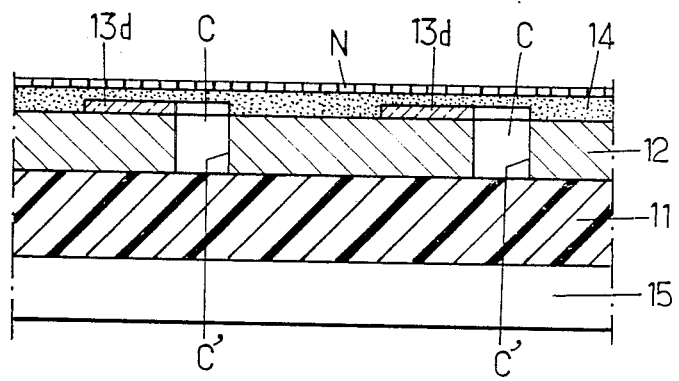

Finally, in FIGS. 11 and 12, an embodiment of a radiative fluxmeter of the invention has been illustrated of the single face type and without a compensation radiative fluxmeter, in which the disymmetry of the chain of thermocouples in series is provided by means of holes or recesses which cut the continuous strip and the discontinuous deposits transversally.

Of course such a fluxmeter could be combined with a compensation fluxmeter, as explained above, and/or be of the double face type, as mentioned above for radiative fluxmeters without holes or recesses.

In the embodiment shown in FIGS. 11 and 12, we find from bottom to top the conducting layer 15, the insulating support 11, continuous strip 12 made for example from constantan and advantageously of a meandering shape, discontinuous deposits referenced 13d, made for example from copper, and a high emissive coating, 14 of the continuous type as in FIGS. 3 and 4 and covering the upper surface of deposits 13d and the continuous strip 12 at the positions not covered with these deposits.

The width both of the continuous strip 12 and of the discontinuous deposits 13d is constant in this embodiment, contrary to what was the case in the other previously described embodiments.

The disymmetry is provided in the fluxmeters shown in FIGS. 11 and 12 by means of holes or recesses C which cut the deposits 13d and the continuous strip 12 orthogonally. It is essential for these holes or recesses C to be offset in the longitudinal direction and always in the same direction with respect to the center of the discontinuous deposits 13d. By longitudinal direction is meant here, as in the other embodiments, the direction in which the continuous strip extends, whether this is rectilinear or meandering as preferred, or possibly wound in a spiral. The holes or recesses C may be either disposed up to one end of the deposits 13d (as in the embodiment shown in FIGS. 11 and 12), or at a certain distance from the same end in the direction of extension of a continuous strip.

The holes or recesses C may be coated on the inside at C' with a conducting material, advantageously the same as that of deposits 13d.

Finally, a "honeycomb" structure N is provided above the emissive coating, 14, the purpose of this structure being to limit the convective effects in the horizontal plane above coating 14 (looking at FIGS. 11 and 12).

It should be noted that such a honeycomb structure may be advantageously disposed also in the embodiments shown in FIGS. 3 to 10. In so far as the operation of the radiative fluxmeter shown in FIGS. 11 and 12 is concerned, it is the holes or recesses C which provide thermal disymmetry, for the thermal flux preferably avoids these holes, since air is a very poor conductor, whereas the first and second conducting materials of the continuous strip 12 and of deposits 13d are much better heat conductors than air. Since the emissive coating, 14 plays the same role in this embodiment as in the preceding embodiments, a temperature difference is then created in the horizontal plane between the left hand and right hand ends (considering FIGS. 11 and 12) of each deposit 13d, which generates an electromotive force of thermoelectric origin at the ends of each elementary thermocouple; now these thermocouples are connected in series by strip 12 and an appreciable potential difference is finally obtained between the ends of the strip through the series arrangement of a very large number of elementary thermocouples.

Figure 13:
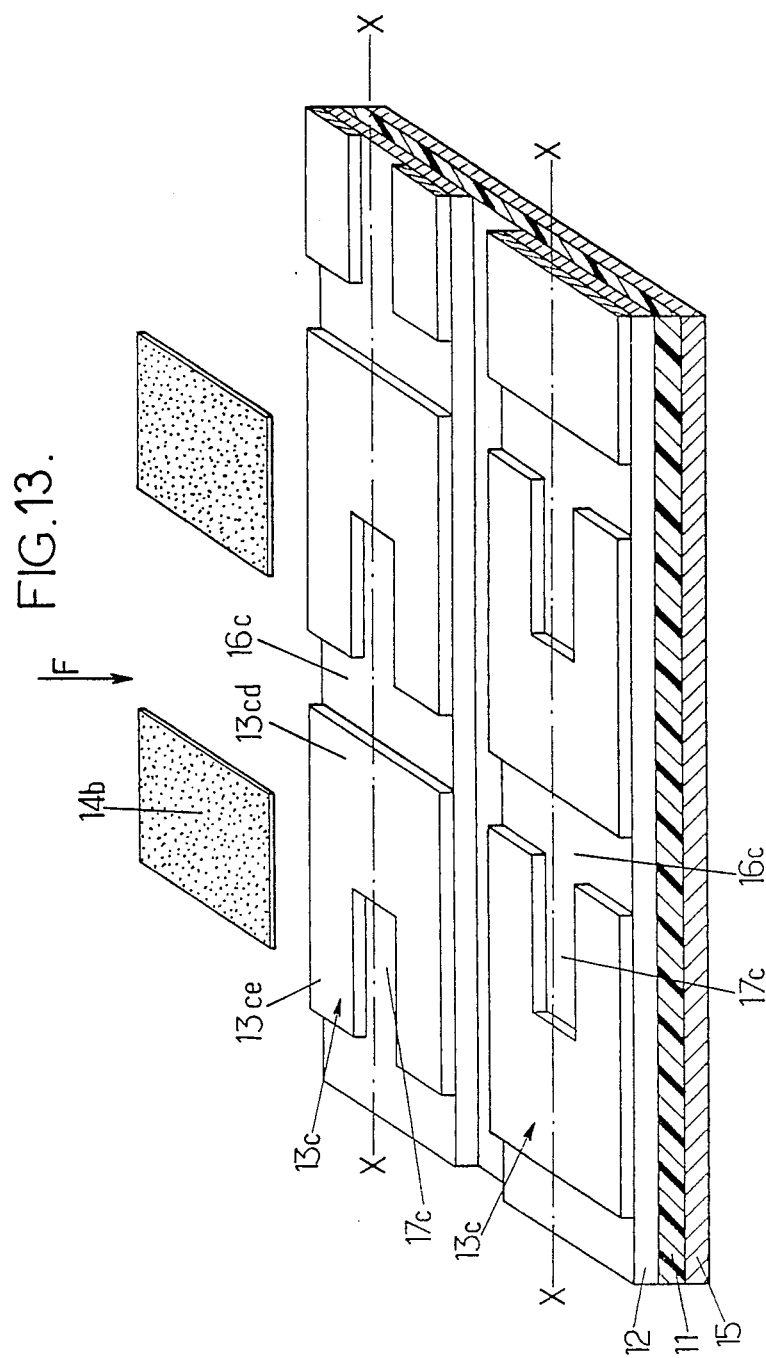
FIGS. 13, 14 and 15 show variants of FIGS. 5, 7 and 8 respectively.

In FIG. 13, a variant of the embodiment of FIG. 5 has been shown, the only difference between the devices of FIGS. 13 and 5 being formed by the shape of the highly emissive coatings referenced 14a in FIG. 5 and 14b in FIG. 13.

In the embodiment of FIG. 5, coatings 14a have the shape of the letter U and entirely cover deposits 13c, whereas, in the variant shown in FIG. 13, the coatings 14b are rectangular and only cover the unnotched parts 13cd of the U shaped deposits 13c and not the legs 13ce of these deposits.

Figure 14:
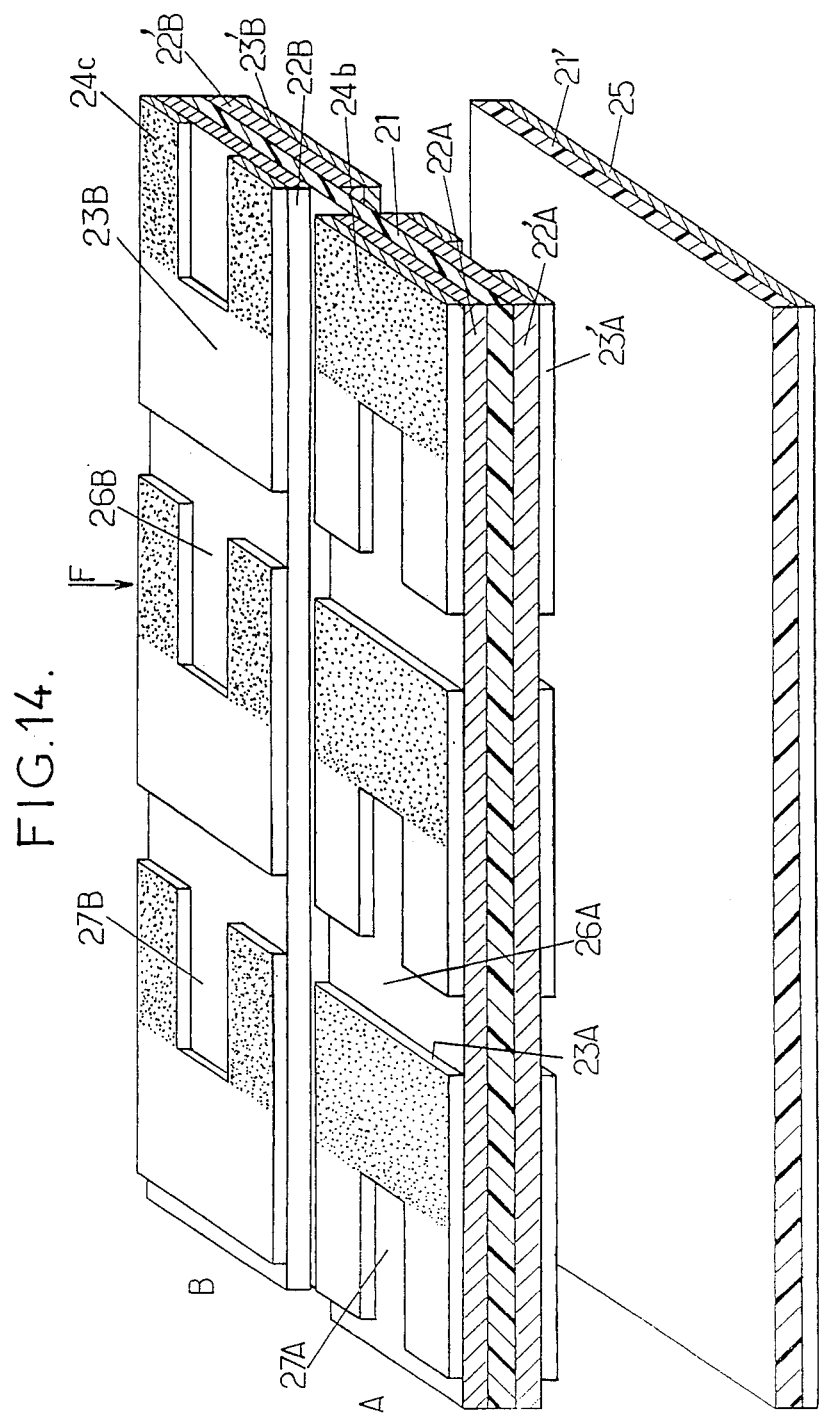
Figure 15:
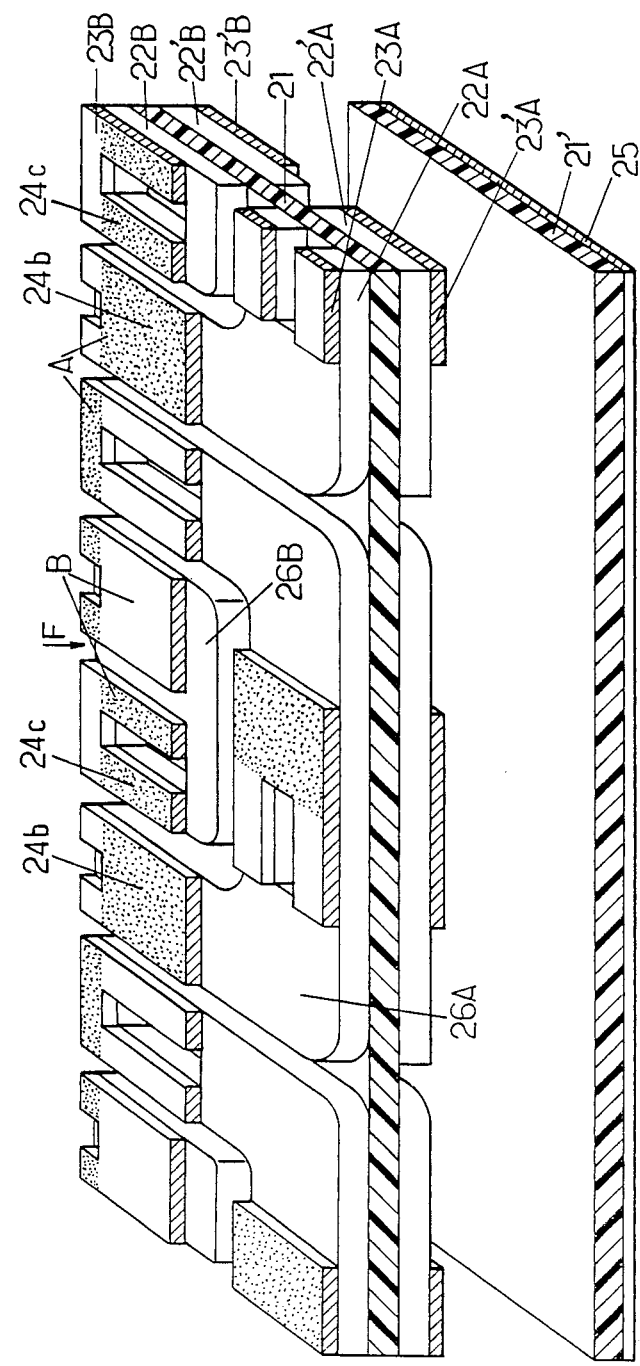

Similarly, in FIGS. 14 and 15, a variant has been illustrated of the assembly of FIGS. 8 and 9, in which variant the highly emissive coatings, on deposits 23A (and 23'A) of the main fluxmeter A, which coatings are referenced 24b, also have a rectangular shape (and not the U shape of the deposits 24A of FIG. 7); on the other hand, highly emissive coatings are also provided on the compensation fluxmeter B, namely on the legs of deposits 23B (and 23'B), these latter coatings being referenced 24c.

In the case of use at high temperatures, which may reach and exceed 600° C. and even up to 1500° C., the thin support 11, 21, 31 in a device of the invention may be formed from an insulating material, not kapton, which material does not resist high temperatures, but from a ceramic such as the product sold by the "Société des Procédés Industriels KAGER", at Steinseltz, France, under the name "TYPE 963" and which is an alumina $Al_2O_3$ based monocomponent system. It is in fact a paste which adheres to the surface to which it is applied and which becomes refractory ceramic after baking. A layer of kapton may also be disposed first of all so as to permit the mechanical assembly then this kapton layer is dissolved in soda, the ceramic paste providing the connection between the parts applied together, for example layers 12 and 15.

Moreover, in the case of the embodiments shown in FIGS. 7-8 and 14-15, the recesses between the legs of the U of the discontinuous deposits 23a and 23b of the upper face and 23'a and 23'b of the lower face may be of a length (in the direction of extension of the continuous strip 26A) such that a part of the internal portion of these recesses of the upper face overlaps a part of the internal portion of the corresponding recesses of the lower face.

A device of the invention, in the case where it includes both a main fluxmeter A and a compensation fluxmeter B allows the intensity of a radiative flux and the intensity of a convective flux to be measured separately. In fact, these two fluxmeters A and B each determine a quantity (in particular an electromotive force) which is a linear function of each of these two fluxes. Thus, if we designate by X and Y respectively the radiative flux and the convective flux, which the assembly of the two fluxes A and B perceives, and four constants by m, n, m' and n', we will have at the outputs of the two fluxmeters A and B the respective values G(A) and G(B) (in particular the electromotive forces) such that:

$$G(A) = mX + nY$$

$$G(B) = m'X + n'Y$$

These two equations with two unknowns X and Y can be resolved into X and Y and, for this, an operational amplifier or a microcomputer can be used which receives G(A) and G(B) (outputs of the fluxmeters A and B, respectively) at its two inputs and which delivers X and Y at its two outputs, the constants m, n, m' and n' being determined.

It will be readily understood that the device or radiative fluxmeter of the invention is distinguished from a radiative fluxmeter of the prior art such as described in the above mentioned U.S. Pat. No. 3,267,727 because of the variation in width of the discontinuous deposits and possibly of the underlying continuous strip, in the longitudinal direction of the strip, and because of a highly emissive coating, covering wholly at least the deposits.

The device or radiative fluxmeter of the invention is further distinguished from the purely thermal fluxmeters as described in the European Pat. No. 0 030 499 and French Pat. No. 2 536 536, both in the name of the Agence Nationale de Valorisation de la Recherche (ANVAR), by the fact that it includes a highly emissive coating, at least over the whole of the surface of the deposits.

The radiative fluxmeter, in the different embodiments, may be constructed as a double face fluxmeter by disposing a continuous strip with its deposits on each side of a common support, at least the deposits being covered with a highly emissive coating, on both faces or on a single face; furthermore, an additional support for the assembly of the fluxmeter may be provided.

Moreover, in all the embodiments, a layer of a good heat conducting material may be provided on the face of the device which will be applied against a surface or wall to be studied.

Finally, it is advantageous to associate, with a radiative fluxmeter of the invention having a single or double face and forming the main fluxmeter, a second thermal compensation fluxmeter with a continuous strip or strips and deposits of the same shape and dimensions as the strip or strips and deposits of the main fluxmeter, by providing as assembly such that the effects of the convective thermal exchanges in the two fluxmeters are the same and are cancelled out in the overall electromotive force obtained at the output of the assembly of the two fluxmeters, this overall electromotive force then being an exact measure of the intensity of the radiative flux which strikes the combined fluxmeter.

The combined fluxmeter may be in fact formed from two radiative fluxmeters disposed side by side, preferably imbricated or interfitted, on the same support, or else it may be formed by a combined fluxmeter including, on a common continuous conducting strip deposits covered with a high emissive power coating for forming a main fluxmeter and deposits not coated with such a coating for forming a compensation fluxmeter, these two sorts of deposits being preferably disposed alternately.

A radiative fluxmeter of the invention finds numerous applications in the thermal field.

Depending on the intensity and/or on the direction of the thermal exchanges detected between a surface or wall and the ambient atmosphere or the surface or wall the fluxmeter of the invention may be used for controlling heating, particularly radiative heating, as a function for example of the solar heat contribution coming from the external environment.

With a radiative fluxmeter of the invention, the radiative and/or thermal balance of a wall may be established.

A fluxmeter of the invention may also be used for detecting heat radiation, for example for measuring the radiation of an oven.

As is evident and as it follows moreover already from what has gone before, the invention is in no wise limited to those of its modes of application and embodiments which have been more especially considered; it embraces, on the contrary, all variants thereof.

Thus, instead of providing a single row of successive conducting deposits on the continuous conducting strip or strips, two or more than two parallel rows of such deposits may be provided.

The deposits of the radiative fluxmeter of the invention could also be given one of the shapes illustrated in the above mentioned European Pat. No. 0 030 499.

What is claimed is:

1. A device for measuring the intensity of a radiative flux comprising:
   (a) a thin support, made from an insulating material, with a first face and a second face;
   (b) a thin elongated continuous strip, made from a first conducting material, having a first face and a second face, said first face being fixed on said first face of said support;
   (c) a series of thin discontinuous deposits, made from a second conducting material, having a first face and a second face and disposed successively in the elongation direction of said strip, with their first face on said second face of said strip, said second conducting material having a thermoelectric power different from that of said first conducting material and a higher electric conductivity, and said deposits being thinner than said strip and each having, in the transverse direction with respect to the elongation direction of said strip, a width which varies between the two ends thereof, in said elongation direction of said strip, the variation in width being in the same direction for deposits succeeding each other in the elongation direction of said strip;
   the assembly formed by each of said deposits and by the portion of said continuous strip located under said second face of said each of said deposits forming an elementary thermocouple;
   (d) a high emissivity coating intimately covering at least a portion of said second face of each of said successive deposits;
   (e) a coating of a heat conducting material applied against said second face of said thin support, said last mentioned coating providing an averaged uniform temperature along said second face of said support; and
   (f) means for determining the electromotive force available at the ends of said elongated continuous strip, which is an indication of the intensity of the radiative flux applied to said device.

2. The device as claimed in claim 1, wherein said continuous strip has a constant width and said discontinuous deposits have the form of a U disposed symmetrically with respect to an axis in said elongation direction of the strip, the openings of the Us being directed in the same direction with respect to the direction of elongation of the strip.

3. The device as claimed in claim 1, wherein said continuous strip has a constant width, said discontinuous deposits have the shape of rectangles of a constant width and it includes holes or recesses which transversely cut the deposits and the underlying continuous strip, all the recesses being offset, in the direction of elongation of said continuous strip, in the same direction with respect to the center of each discontinuous deposit.

4. The device as claimed in claim 1, further including a coating with high emissivity covering both said discontinuous deposits and the zones of said continuous strip not covered with the deposits.

5. The device as claimed in claim 1, including a coating with high emissivity covering, exclusively, at least portions of said deposits.

6. The device as claimed in claim 5, including a reflecting coating, with low emissivity, on the zones of said continuous strip not covered with deposits.

7. The device as claimed in claim 1, wherein said continuous strip is bent so as to have a meandering configuration.

8. The device as claimed in claim 1, wherein said first conducting material forming said continuous strip is the alloy called "constantan" and said second conducting material forming the deposits is copper.

9. The device as claimed in claim 1, wherein said coating with high emissivity is formed by black matt paint.

10. The device as claimed in claim 5, wherein the deposits are made from copper and said highly emissive coating on the deposits is formed by a film of black copper oxide on the deposits, this film being obtained by surface oxidation of the copper of the deposits by heating these latter to a high temperature in an oxidizing atmosphere.

11. The device as claimed in claim 6, wherein said reflecting coating with low emissivity is formed by a film of aluminium or an aluminium paint.

12. The device as claimed in claim 1, including against each face of the support, a continuous strip covered with deposits with the high emissive power coating on at least the deposits of one of the faces.

13. The device as claimed in claim 12, further including an additional support, also made from an insulating material, which is applied against one of its faces, which is to be applied against a surface or wall where a radiative flux is to be measured, whereas the other face receives the radiative flux to be measured, with a heat conducting layer deposited on the face of the additional support which is not against the flux-receiving active part of the device.

14. A device for measuring the intensity of a radiative flux comprising:
 (a) a thin support, made from an insulating material, with a first face and a second face;
 (b) a thin elongated continuous strip, made from a first conducting material, having a first face and a second face, said first face being fixed on said first face of said support;
 (c) a series of thin discontinuous deposits, made from a second conducting material, having a first face and a second face and disposed successively in the elongation direction of said strip, with their first face on said second face of said strip, said second conducting material having a thermoelectric power different from that of said first conducting material and a higher electric conductivity, and said deposits being thinner than said strip and each having, in the transverse direction with respect to the elongation direction of said strip, a width which varies between the two ends thereof, in said elongation direction of said strip, the variation in width being in the same direction for deposits succeeding each other in the elongation direction of said strip;
 the assembly formed by each of said deposits and by the portion of said continuous strip located under said second face of said each of said deposits forming an elementary thermocouple;
 (d) a high emissivity coating intimately covering at least a portion of said second face of each of said successive deposits; and
 (e) means for determining the electromotive force available at the ends of said elongated continuous strip, which is an indication of the intensity of the radiative flux applied to said device;
 wherein said continuous stirp is formed by a continuous succession of isoceles or, at the limit, equilateral triangles in contact with each other and whose axes of symmetry are aligned along an axis in said elongation direction of the strip and whose apices disposed along this axis of elongation are directed in the same direction with respect to the direction of elongation to the strip; and the deposits are formed by a succession of isoceles trapezia whose large bases coincide with the large bases of said triangles and whose small bases are disposed at a distance from said apices.

15. A device for measuring the intensity of a radiative flux comprising:
 (a) a thin support, made from an insulating material, with a first face and a second face;
 (b) a thin elongated continuous strip, made from a first conducting material, having a first face and a second face, said first face being fixed on said first face of said support;
 (c) a series of thin discontinuous deposits, made from a second conducting material, having a first face and a second face and disposed successively in the elongation direction of said strip, with their first face on said second face of said strip, said second conducting material having a thermoelectric power different from that of said first conducting material and a higher electric conductivity, and said deposits being thinner than said strip and each having, in the transverse direction with respect to the elongation direction of said strip, a width which varies between the two ends thereof, in said elongation direction of said strip, the variation in width being in the same direction for deposits succeeding each other in the elongation direction of said strip;
 the assembly formed by each of said deposits and by the portion of said continuous strip located under said second face of said each of said deposits forming an elementary thermocouple;
 (d) a high emissivity coating intimately covering at least a portion of said second face of each of said successive deposits; and
 (e) means for determining the electromotive force available at the ends of said elongated continuous strip, which is an indication of the intensity of the radiative flux applied to said device;
 wherein said continuous strip is formed by an uninterrupted succession of units having the form of a letter T in contact with each other and the discontinuous deposits also have the shape of the letter T, the axes of symmetry of the "T"s of the strip and of the deposits being aligned along an axis in said elongation direction of the strip, the longitudinal bars of the Ts being directed in the same direction with respect to the direction of elongation of the strip and the longitudinal bars of the Ts of the deposits being shorter than the longitudinal bars of the Ts of the continuous strip.

16. A device for measuring the intensity of a radiative flux comprising:
 (a) a thin support, made from an insulating material, with a first face and a second face;
 (b) a thin elongated continuous strip, made from a first conducting material, having a first face and a second face, said first face being fixed on said first face of said support;
 (c) a series of thin discontinuous deposits, made from a second conducting material, having a first face and a second face and disposed successively in the elongation direction of said strip, with their first face on said second face of said strip, said second conducting material having a thermoelectric power different from that of said first conducting material and a higher electric conductivity, and said deposits being thinner than said strip and each having, in the transverse direction with respect to the elongation direction of said strip, a width which varies between the two ends thereof, in said elongation direction of said strip, the variation in width being in the same direction for deposits succeeding each other in the elongation direction of said strip;

the assembly formed by each of said deposits and by the portion of said continuous strip located under said second face of said each of said deposits forming an elementary thermocouple;

(d) a high emissivity coating intimately covering at least a portion of said second face of each of said successive deposits; and (e) means for determining the electromotive force available at the ends of said elongated continuous strip, which is an indication of the intensity of the radiative flux applied to said device;

further including a "honeycomb" structure on the face of the device receiving the radiative flux above said highly emissive coating.

17. A device for measuring the intensity of a radiative flux comprising:

(a) a thin support, made from an insulating material, with a first face and a second face;

(b) a thin elongated continuous strip, made from a first conducting material, having a first face and a second face, said first face being fixed on said first face of said support;

(c) a series of thin discontinuous deposits, made from a second conducting material, having a first and a second face and disposed successively in the elongation direction of said strip, with their first face on said second face of said strip, said second conducting material having a thermoelectric power different from that of said first conducting material and a higher electric conductivity, and said deposits being thinner than said strip and each having, in the transverse direction with respect to the elongation direction of said strip, a width which varies between the two ends thereof, in said elongation direction of said strip, the variation in width being in the same direction for deposits succeeding each other in the elongation direction of said strip;

the assembly formed by each of said deposits and by the portion of said continuous strip located under said second face of said each of said deposits forming an elementary thermocouple;

(d) a high emissivity coating intimately covering at least a portion of said second face of each of said successive deposits; and (e) means for determining the electromotive force available at the ends of said elongated continuous strip, which is an indication of the intensity of the radiative flux applied to said device;

associated with a similar compensation fluxmeter including a continuous strip and deposits, but the latter not covered with highly emissive coatings, this strip and these coatings having the same shape and the same dimensions as said continuous strip and said deposits of the device forming the main fluxmeter, and this compensation fluxmeter measuring the convective thermal exchanges to which the main fluxmeter device is subjected.

18. The device with compensation fluxmeter as claimed in claim 17, wherein said continuous strips with the deposits of the main fluxmeter device and the compensation fluxmeter are disposed on a common insulating support while being imbricated in each other.

19. The device with thermal fluxmeter as claimed in claim 17, wherein the mail fluxmeter device and the compensation fluxmeter are formed from a common support and a common continuous strip covered with alternate deposits belonging respectively to the main fluxmeter device and to the compensation fluxmeter, the deposits covered with a highly emissive coating of the main fluxmeter device alternating with the deposits without such a coating of the compensation fluxmeter and the two types of alternate deposits being orientated in opposite directions in so far as the variation of width is concerned, with respect to the direction of elongation of the common continuous strip.

20. The device as claimed in claim 17, including means with two inputs receiving the electromotive forces available at the ends of the continuous elonagated strip of the main fluxmeter and of the compensation fluxmeter respectively, these means being adapted for determining and delivering at their two outputs two signals representative respectively of the radiative flux and of the convective flux received by the main fluxmeter device.

21. The device as claimed in claim 17, wherein the recesses between the legs of the U of the discontinuous deposits of the upper face and of the lower face are of a length, in the direction of elongation of the continuous strip, such that a part of the internal portion of these recesses of the upper face overlaps a part of the internal portion of the corresponding recesses of the lower face.

* * * * *